(12) United States Patent
Okada et al.

(10) Patent No.: US 8,749,076 B2
(45) Date of Patent: Jun. 10, 2014

(54) RESIN PASTE COMPOSITION (75) Inventors: Chiaki Okada, Ibaraki (JP); Kazuhiko Yamada, Ibaraki (JP); Yukari Inoue, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/704,639

(22) PCT Filed: Jun. 10, 2011

(86) PCT No.: PCT/JP2011/063374
§ 371 (c)(1),
(2), (4) Date: Jan. 18, 2013

(87) PCT Pub. No.: WO2011/158753
PCT Pub. Date: Dec. 22, 2011

(65) Prior Publication Data
US 2013/0113121 A1 May 9, 2013

(30) Foreign Application Priority Data

Jun. 17, 2010 (JP) ................................. 2010-138560

(51) Int. Cl.
*H01L 23/29* (2006.01)
*B44C 1/17* (2006.01)
*H05K 1/03* (2006.01)

(52) U.S. Cl.
USPC .... 257/789; 257/783; 257/793; 257/E21.514; 156/241; 156/283; 156/326; 156/327; 156/330; 174/256; 174/259

(58) Field of Classification Search
USPC ......................................................... 257/783
See application file for complete search history.

(56) References Cited

FOREIGN PATENT DOCUMENTS

| JP | 11-92625 | * | 4/1999 | ............... C08I 63/00 |
|----|----------|---|--------|--------------------------|
| JP | 2002-179769 | | 6/2002 | |
| JP | 2005-197118 | | 7/2005 | |
| JP | 2006-73812 | | 3/2006 | |
| JP | 2009-70916 | | 4/2009 | |
| JP | 2009-259839 | | 11/2009 | |

* cited by examiner

*Primary Examiner* — Jasmine Clark
(74) *Attorney, Agent, or Firm* — Antonelli. Terry, Stout & Kraus, LLP.

(57) ABSTRACT

The present invention relates to a resin paste composition including an organic compound, and a granular aluminum powder having an average particle diameter of from 2 to 10 μm and a flake-shaped silver powder having an average particle diameter of from 1 to 5 μm which are uniformly dispersed in the organic compound, and a semiconductor device manufactured by bonding a semiconductor element onto a supporting member through the resin paste composition and then encapsulating the resulting bonded product. According to the present invention, it is possible to provide a resin paste composition used for bonding an element such as semiconductor chips onto a lead frame which is excellent in not only electrical conductivity and bonding property but also working efficiency without using a large amount of rare and expensive silver, and a semiconductor device having a high productivity and a high reliability.

20 Claims, 2 Drawing Sheets

RESIN PASTE COMPOSITION

TECHNICAL FIELD

The present invention relates to resin paste compositions suitably used for bonding semiconductor elements such as IC and LSI onto a lead frame, a glass epoxy wiring board, etc., and semiconductor devices manufactured using the resin paste compositions.

BACKGROUND ART

As die-bonding materials for semiconductors, there are conventionally known Au—Si eutectic crystals, solders, resin paste compositions or the like. Among these materials, the resin paste compositions have been extensively used in view of high working efficiency and low costs.

In general, semiconductor devices have been manufactured by bonding elements such as semiconductor chips onto a lead frame through a die-bonding material. The semiconductor elements such as semiconductor chips have been required to have a high reliability of their properties such as electrical conductivity, thermal conductivity and bond strength with the enhancement of integration and fineness of the respective elements.

To meet the above requirements, it may be considered that resin paste compositions used for bonding the elements such as semiconductor chips onto the lead frame contain a conductive filler such as a metal powder, for example, a gold powder, a silver powder and a copper powder. Among these resin paste compositions, those containing a silver powder have been predominantly employed at the present time because the silver powder is not as rare as the gold powder and not readily oxidized nor deteriorated in storage stability as compared to the copper powder, and further is excellent in not only working efficiency and mechanical properties but also various other properties required for the resin paste compositions (refer to Patent Document 1, etc.).

However, the silver powder itself is a noble metal material and therefore still a rare material. For this reason, there is an increasing demand for die-bonding materials using the other more available filler material. However, at present, there have not been obtained any resin paste compositions using an alternate material for the silver powder which are capable of exhibiting properties equal to or superior to those using the silver powder.

PRIOR DOCUMENTS

Patent Documents

Patent Document 1: JP 2002-179769A

SUMMARY OF THE INVENTION

Problem to be Solved by the Invention

An object of the present invention is to provide a solvent-free resin paste composition used for bonding an element such as semiconductor chips onto a lead frame which is excellent in electrical conductivity, bonding property and coatability, in particular, to provide a die-bonding paste which is excellent in not only electrical conductivity, bonding property and storage stability but also coatability and mechanical properties without using a large amount of silver having a high rarity.

Means for Solving the Problem

The present inventors have found that when using a more available aluminum powder modified into a specific form, it is possible to obtain a die-bonding paste which is excellent in various properties such as electrical conductivity and bonding property (hereinafter occasionally referred to as bond strength or die shear strength). The present invention has been accomplished on the basis of the above finding.

Thus, the present invention relates to a resin paste composition including an organic compound, and a granular aluminum powder having an average particle diameter of from 2 to 10 μm and a flake-shaped silver powder having an average particle diameter of from 1 to 5 μm which are uniformly dispersed in the organic compound. The present invention also relates to a semiconductor device manufactured by bonding a semiconductor element onto a supporting member through the resin paste composition and then encapsulating the resulting bonded product. Meanwhile, the "organic compound" as used herein means a so-called binder which serves as a matrix for dispersing an aluminum powder or the like therein to form a resin paste. Examples of the organic compound include resins such as an epoxy resin, a silicone resin, a urethane resin and an acrylic resin, and a curing acrylic compound. Examples of the preferred acrylic compound include an acrylic ester compound and a methacrylic ester compound. The resin paste composition of the present invention preferably further contains an additive such as an initiator, a flexibilizer and a coupling agent.

Effect of the Invention

In the resin paste composition of the present invention, a more available aluminum powder is used as a filler, and therefore it is possible to provide a resin paste composition capable of maintaining properties of the conventional compositions while reducing an amount of an expensive silver powder used therein. The resin paste composition can be suitably used as a die-bonding paste.

BRIEF DESCRIPTION OF THE DRAWINGS

FIG. 1(A) to FIG. 1(E) are microphotographs each showing an appearance of particles of an aluminum powder used in a resin paste composition in which FIG. 1(A) to FIG. 1(C) are microphotographs of granular aluminum powders marketed under product names "No. 800F", "VA-2000" and "No. 500M", respectively, whereas FIG. 1(D) and FIG. 1(E) are microphotographs of flake-shaped aluminum powders marketed under product names "No. 500D" and "No. 22000", respectively.

FIG. 3(A) and FIG. 3(B) are microphotographs each showing a condition of a mixture of particles in a resin paste when using combination of a silver powder and an aluminum powder according to the present invention or combination of different kinds of silver powders in which FIG. 3(A) shows the condition of a mixed powder in the resin paste when using combination of the silver powder and the aluminum powder as used in Examples 1 and 4 to 8, whereas FIG. 3(B) shows the condition of a mixed powder in the resin paste when using combination of the different kinds of silver powders as used in Comparative Example 1.

PREFERRED EMBODIMENTS FOR CARRYING OUT THE INVENTION

The resin paste composition of the present invention contains a specific aluminum powder and a silver powder, and an organic compound as a binder. In particular, the resin paste composition of the present invention may be used as a die-bonding material for bonding a semiconductor element onto a lead frame, a glass epoxy wiring board, etc.

The resin paste composition of the present invention is formed by replacing a part or whole of a silver powder used as a filler in the conventional resin pastes with a specific aluminum powder. The aluminum powder used in the present invention has an average particle diameter of 10 µm or less, preferably from 2 to 9 µm and more preferably from 3 to 8 µm.

The aluminum powder preferably has an apparent density of from 0.40 to 1.20 g/cm$^3$ and more preferably from 0.55 to 0.95 g/cm$^3$. The aluminum powder usually has a granular shape, but the granular aluminum powder may be used in combination with an aluminum powder having the other shape such as a flake shape, a spherical shape, an acicular shape and an irregular shape unless the properties of the resin paste composition according to the present invention are adversely affected.

When the average particle diameter of the aluminum powder is 10 µm or more, the resulting resin paste composition tends to be deteriorated in uniformity and various properties. Meanwhile, the average particle diameter of the aluminum powder means the value of a median diameter D50 as measured using an analyzer "Microtrac X100" (by a laser diffraction light scattering particle size distribution measuring method).

On the other hand, the silver powder which may be used in combination with the aluminum powder is also preferably a specific silver powder. When the above specific aluminum powder is used in combination with the specific silver powder, it is possible to use the resulting mixed powder as an alternate material for a silver powder in the conventional compositions and obtain a resin paste composition which is excellent in not only electrical conductivity, bonding property and storage stability but also coatability and mechanical properties.

The silver powder used in the present invention has an average particle diameter of from 1 to 5 µm, a tap density of from 3 to 6 g/cm$^3$ and a specific surface area of from 0.5 to 1 m$^2$/g. The average particle diameter of the silver powder is the value as measured by a laser diffraction light scattering particle size distribution measuring method. Examples of a shape of the silver powder include a granular shape, a flask shape, a spherical shape, an acicular shape and an irregular shape. Among these silver powders, preferred are those having a flake shape.

Meanwhile, the "granular shape, flake shape, spherical shape and acicular shape" of the silver powder and the aluminum powder as used herein respectively have the following definitions.

The "granular shape" as used herein means not an irregular shape but a shape having a substantially uniform dimension (refer to JIS Z2500:2000).

The "flake shape" as used herein means a plate-like shape (refer to JIS Z2500:2000) which is also referred to as a scale shape because of a very thin plate shape like a scale. In the present invention, the flake-shaped powder means those having an average thickness (t) of from 0.1 to 15 µm and an aspect ratio (average particle diameter (a)/average thickness (t)) of from 2 to 1000 as determined from analysis of the results of SEM observation. The average particle diameter (a) as used herein is defined by a square root of an area (S) of each particle of the flake-shaped powder as viewed in a plan of the flake-shaped particle.

The "spherical shape" as used herein means a shape substantially equal to a sphere (refer to JIS Z2500:2000), but is not necessarily a true sphere and preferably means a particle shape having a ratio of a long diameter (DL) to a short diameter (DS) (DL/DS) (hereinafter occasionally referred to as a "spherical coefficient" or a "true sphericity") which lies within the range of from 1.0 to 1.2.

The "acicular shape" as used herein means a needle-like shape (refer to JIS Z2500:2000).

The total amount of the aluminum powder and the silver powder compounded in the resin paste composition when using the aluminum powder and the silver powder in combination with each other is preferably from 60 to 85 parts by weight, more preferably from 65 to 80 parts by weight and still more preferably from 70 to 80 parts by weight on the basis of 100 parts by weight of a total amount of the resin paste composition. When the total amount of the aluminum powder and the silver powder compounded in the resin paste composition lies within the above-specified range, the resulting resin paste composition can exhibit good properties such as electrical conductivity (volume resistivity) and viscosity which are more suitable when used as a die-bonding material.

The weight ratio of the aluminum powder to the silver powder compounded in the resin paste composition (aluminum powder/silver powder) is preferably from 1/9 to 8/2, more preferably from 3/7 to 7/3 and still more preferably from 4/6 to 5/5. When the weight ratio of the aluminum powder to the silver powder compounded in the resin paste composition is more than 8/2, the resulting resin paste composition tends to exhibit a high resistance, a low bond strength and a high viscosity and therefore tends to be deteriorated in working efficiency upon handling and coatability upon use. When the weight ratio of the aluminum powder to the silver powder compounded in the resin paste composition is not less than 1/9 but not more than 8/2, there is a tendency that the resulting resin paste composition can be enhanced in thermal conductivity while maintaining a good electrical conductivity (volume resistivity).

The organic compound used in the present invention serves as a so-called matrix component for dispersing the specific silver powder and aluminum powder therein. As the organic compound, there may be used various resins and a curing acrylic compound. Examples of the resins include an epoxy resin, a silicone resin, a urethane resin and an acrylic resin. Examples of the curing acrylic compound include an acrylic ester compound and a methacrylic ester compound.

The acrylic ester compound or methacrylic ester compound used in the present invention is a compound containing at least one acryloyloxy group or methacryloyloxy group in a molecule thereof. As the acrylic ester compound or methacrylic ester compound, there may be used those compounds represented by the following general formulae (I) to (X).

(1) Compounds Represented by the General Formula (I):

wherein $R^1$ represents hydrogen or a methyl group; and $R^2$ represents a divalent aliphatic or cyclic structure-containing aliphatic hydrocarbon group having 1 to 100 carbon atoms and preferably 1 to 36 carbon atoms.

Examples of the compounds represented by the general formula (I) include acrylate compounds such as methyl acrylate, ethyl acrylate, n-propyl acrylate, isopropyl acrylate, n-butyl acrylate, isobutyl acrylate, t-butyl acrylate, amyl acrylate, isoamyl acrylate, hexyl acrylate, heptyl acrylate, octyl acrylate, 2-ethylhexyl acrylate, nonyl acrylate, decyl acrylate, isodecyl acrylate, lauryl acrylate, tridecyl acrylate, hexadecyl acrylate, stearyl acrylate, isostearyl acrylate, cyclohexyl acrylate, isobornyl acrylate, tricyclo[$5.2.1.0^{2,6}$] decyl acrylate and 2-(tricyclo)[$5.2.1.0^{2,6}$]deca-3-en-8 or 9-yloxyethyl acrylate(dicyclopentenyloxyethyl acrylate); and methacrylate compounds such as methyl methacrylate, ethyl methacrylate, n-propyl methacrylate, isopropyl methacrylate, n-butyl methacrylate, isobutyl methacrylate, t-butyl methacrylate, amyl methacrylate, isoamyl methacrylate, hexyl methacrylate, heptyl methacrylate, octyl methacrylate, 2-ethylhexyl methacrylate, nonyl methacrylate, decyl methacrylate, isodecyl methacrylate, lauryl methacrylate, tridecyl methacrylate, hexadecyl methacrylate, stearyl methacrylate, isostearyl methacrylate, cyclohexyl methacrylate, isobornyl methacrylate, tricyclo [$5.2.1.0^{2,6}$]decyl methacrylate and 2-(tricyclo)[$5.2.1.0^{2,6}$]deca-3-en-8 or 9-yloxyethyl methacrylate(dicyclopentenyloxyethyl methacrylate).

(2) Compounds Represented by the General Formula (II):

(II)

wherein $R^1$ and $R^2$ are respectively the same as defined above.

Examples of the compounds represented by the general formula (II) include acrylate compounds such as 2-hydroxyethyl acrylate, 2-hydroxypropyl acrylate and dimer diol monoacrylates; and methacrylate compounds such as 2-hydroxyethyl methacrylate, 2-hydroxypropyl methacrylate and dimer diol monomethacrylates.

(3) Compounds Represented by the General Formula (III):

(III)

wherein $R^1$ is the same as defined above; $R^3$ is hydrogen, a methyl group or a phenoxymethyl group; $R^4$ is hydrogen, an alkyl group having 1 to 6 carbon atoms, a phenyl group or a benzoyl group; and n is an integer of 1 to 50.

Examples of the compounds represented by the general formula (III) include acrylate compounds such as diethylene glycol acrylate, polyethylene glycol acrylate, polypropylene glycol acrylate, 2-methoxyethyl acrylate, 2-ethoxyethyl acrylate, 2-butoxyethyl acrylate, methyoxydiethylene glycol acrylate, methoxypolyethylene glycol acrylate, 2-phenoxyethyl acrylate, phenoxydiethylene glycol acrylate, phenoxypolyethylene glycol acrylate, 2-benzoyloxyethyl acrylate and 2-hydroxy-3-phenoxypropyl acrylate; and methacrylate compounds such as diethylene glycol methacrylate, polyethylene glycol methacrylate, polypropylene glycol methacrylate, 2-methoxyethyl methacrylate, 2-ethoxyethyl methacrylate, 2-butoxyethyl methacrylate, methyoxydiethylene glycol methacrylate, methoxypolyethylene glycol methacrylate, 2-phenoxyethyl methacrylate, phenoxydiethylene glycol methacrylate, phenoxypolyethylene glycol methacrylate, 2-benzoyloxyethyl methacrylate and 2-hydroxy-3-phenoxypropyl methacrylate.

(4) Compounds Represented by the General Formula (IV):

(IV)

wherein $R^1$ is the same as defined above; $R^5$ is a phenyl group, a nitrile group, $-Si(OR^6)_3$ (wherein $R^6$ is an alkyl group having 1 to 6 carbon atoms), or a group selected from the group consisting of those groups represented by the following formulae:

(wherein $R^7$, $R^8$ and $R^9$ are each independently hydrogen or an alkyl group having 1 to 6 carbon atoms; and $R^{10}$ is hydrogen, an alkyl group having 1 to 6 carbon atoms or a phenyl group); and m is a number of 0, 1, 2 or 3.

Examples of the compounds represented by the general formula (IV) include acrylate compounds such as benzyl acrylate, 2-cyanoethyl acrylate, γ-acryloxypropyl trimethoxysilane, glycidyl acrylate, tetrahydrofurfuryl acrylate, tetrahydropyranyl acrylate, dimethylaminoethyl acrylate, diethylaminoethyl acrylate, 1,2,2,6,6-pentamethyl piperidinyl acrylate, 2,2,6,6-tetramethyl piperidinyl acrylate, acryloxyethyl phosphate, acryloxyethylphenyl acid phosphate, β-acryloyloxyethyl hydrogen phthalate and β-acryloyloxyethyl hydrogen succinate; and methacrylate compounds such as methacrylates, e.g., benzyl methacrylate, 2-cyanoethyl methacrylate, γ-methacryloxypropyl trimethoxysilane, glycidyl methacrylate, tetrahydrofurfuryl methacrylate, tetrahydropyranyl methacrylate, dimethylaminoethyl methacrylate, diethylaminoethyl methacrylate, 1,2,2,6,6-pentamethyl piperidinyl methacrylate, 2,2,6, 6-tetramethyl piperidinyl methacrylate, methacryloxyethyl phosphate and methacryloxyethylphenyl acid phosphate, β-methacryloyloxyethyl hydrogen phthalate and β-methacryloyloxyethyl hydrogen succinate.

(5) Compounds Represented by the General Formula (V):

wherein $R^1$ and $R^2$ are respectively the same as defined above.

Examples of the compounds represented by the general formula (V) include diacrylate compounds such as ethylene glycol diacrylate, 1,4-butanediol diacrylate, 1,6-hexanediol diacrylate, 1,9-nonanediol diacrylate, 1,3-butanediol diacrylate, neopentyl glycol diacrylate, dimer diol diacrylates and dimethylol tricyclodecane diacrylate; and dimethacrylate compounds such as ethylene glycol dimethacrylate, 1,4-butanediol dimethacrylate, 1,6-hexanediol dimethacrylate, 1,9-nonanediol dimethacrylate, 1,3-butanediol dimethacrylate, neopentyl glycol dimethacrylate, dimer diol dimethacrylates and dimethylol tricyclodecane dimethacrylate.

(6) Compounds Represented by the General Formula (VI):

wherein $R^1$, $R^3$ and n are respectively the same as defined above with the proviso that when $R^3$ is hydrogen or a methyl group, n is not 1.

Examples of the compounds represented by the general formula (VI) include diacrylate compounds such as diethylene glycol diacrylate, triethylene glycol diacrylate, tetraethylene glycol diacrylate, polyethylene glycol diacrylate, tripropylene glycol diacrylate and polypropylene glycol diacrylate; and dimethacrylate compounds such as diethylene glycol dimethacrylate, triethylene glycol dimethacrylate, tetraethylene glycol dimethacrylate, polyethylene glycol dimethacrylate, tripropylene glycol dimethacrylate and polypropylene glycol dimethacrylate.

(7) Compounds Represented by the General Formula (VII):

wherein $R^1$ is the same as defined above; and $R^{11}$ and $R^{12}$ are each independently hydrogen or a methyl group.

Examples of the compounds represented by the general formula (VII) include reaction products obtained by reacting 1 mol of bisphenol A, bisphenol F or bisphenol AD with 2 mol of glycidyl acrylate, and reaction products obtained by reacting 1 mol of bisphenol A, bisphenol F or bisphenol AD with 2 mol of glycidyl methacrylate.

(8) Compounds Represented by the General Formula (VIII):

wherein $R^1$, $R^{11}$ and $R^{12}$ are respectively the same as defined above; $R^{13}$ and $R^{14}$ are each independently hydrogen or a methyl group; and p and q are each independently an integer of 1 to 20.

Examples of the compounds represented by the general formula (VIII) include diacrylates of an adduct of bisphenol A, bisphenol F or bisphenol AD with polyethyleneoxide, diacrylates of an adduct of bisphenol A, bisphenol F or bisphenol AD with polypropyleneoxide, dimethacrylates of an adduct of bisphenol A, bisphenol F or bisphenol AD with polyethyleneoxide, and dimethacrylates of an adduct of bisphenol A, bisphenol F or bisphenol AD with polypropyleneoxide.

(9) Compounds Represented by the General Formula (IX):

wherein $R^1$ is the same as defined above; $R^{15}$, $R^{16}$, $R^{17}$ and $R^{18}$ are each independently hydrogen or a methyl group; and x is an integer of 1 to 20.

Examples of the compounds represented by the general formula (IX) include bis(acryloxypropyl)polydimethyl siloxane, bis(acryloxypropyl)methyl siloxane-dimethyl siloxane copolymers, bis(methacryloxypropyl)polydimethyl siloxane and bis(methacryloxypropyl)methyl siloxane-dimethyl siloxane copolymers.

(10) Compounds Represented by the General Formula (X):

(X)

wherein $R^1$ is the same as defined above; and r, s, t and u are each independently a number of 0 or more as an average value of repeating numbers with the proviso that a sum of r and t (r+t) is 0.1 or more and preferably from 0.3 to 5, and a sum of s+u (s+u) is 1 or more and preferably from 1 to 100.

Examples of the compounds represented by the general formula (X) include reaction products obtained by reacting maleic anhydride-added polybutadiene with 2-hydroxyethyl acrylate or 2-hydroxyethyl methacrylate and hydrogenated products thereof. Specific examples of the compounds represented by the general formula (X) include commercially available products such as "MM-1000-80" and "MAC-1000-80" (tradenames) both available from Nippon Petrochemicals Co., Ltd.

As the acrylic ester compound or the methacrylic ester compound, the above-described compounds may be used singly or in combination of any two or more thereof.

When using the acrylic ester compound or the methacrylic ester compound in combination with the specific silver powder and aluminum powder, the resulting resin paste composition is excellent in not only electrical conductivity, bonding property and storage stability but also coatability and mechanical properties and therefore can be suitably used as a die-bonding material. In view of the above merits, it is preferable to use the acrylic ester compound or the methacrylic ester compound as the organic compound.

The amount of the acrylic ester compound or the methacrylic ester compound compounded in the resin paste composition is preferably from 5 to 25 parts by weight, more preferably from 8 to 20 parts by weight and still more preferably from 10 to 20 parts by weight on the basis of 100 parts by weight of a total amount of the resin paste composition.

In the present invention, from the viewpoints of a high bond strength and a good working efficiency (low viscosity), the acrylic ester compound or the methacrylic ester compound preferably contains at least the above compound represented by the general formula (I).

In addition, when using the acrylic ester compound or the methacrylic ester compound as the above curing acrylic compound, in order to facilitate curing of the resin paste composition, an initiator may be used in combination therewith. The initiator is preferably a radical initiator.

The radical initiator used in the present invention is not particularly limited, and is preferably a peroxide from the viewpoint of preventing occurrence of voids, etc. Further, from the viewpoints of good curability and viscosity stability of the resulting resin paste composition, the radical initiator is more preferably a peroxide having a decomposition temperature of from 70 to 170° C. as measured in an accelerated heating test.

Specific examples of the radical initiator include 1,1,3,3-tetramethylperoxy 2-ethyl hexanoate, 1,1-bis(t-butylperoxy)cyclohexane, 1,1-bis(t-butylperoxy)cyclododecane, di-t-butylperoxyisophthalate, t-butyl perbenzoate, dicumyl peroxide, t-butylcumyl peroxide, 2,5-dimethyl-2,5-di(t-butylperoxy)hexane, 2,5-dimethyl-2,5-di(t-butylperoxy)hexyne and cumene hydroperoxide.

The amount of the radical initiator compounded in the resin paste composition, if used, is preferably from 0.1 to 5 parts by weight and more preferably from 0.6 to 1 part by weight on the basis of 100 parts by weight of a total amount of the resin paste composition. When the amount of the radical initiator compounded in the resin paste composition is less than 0.1 part by weight, the resulting resin paste composition tends to be deteriorated in curability. When the amount of the radical initiator compounded in the resin paste composition is more than 5 parts by weight, the resulting resin paste composition tends to contain a large amount of volatile components so that there is a tendency that so-called voids are readily formed in a cured product of the composition.

In the present invention, the binder resin as the above organic compound may include an epoxy resin, a silicone resin, a urethane resin, an acrylic resin or the like. These resins may also be used in combination in the system using the acrylic ester compound or the methacrylic ester compound as the above curing acrylic compound which serves as the organic compound used in the present invention. For example, an acrylic compound may be used in combination with an epoxy resin to prepare the resin paste composition.

The epoxy resin used in the present invention is not particularly limited as long as the resin is in the form of a compound containing two or more epoxy groups in a molecule thereof. Examples of the epoxy resin include bisphenol A-type epoxy resins "AER-X8501" (tradename) available from Asahi Kasei Corp., "R-301" (tradename) available from Japan Epoxy Resin Corp., and "YL-980" (tradename) available from Japan Epoxy Resin Corp.; a bisphenol F-type epoxy resin "YDF-170" (tradename) available from Toto Kasei Co., Ltd.; a bisphenol AD-type epoxy resin "R-1710" (tradename) available from Mitsui Chemicals, Inc.; phenol novolak-type epoxy resins "N-730S" "(tradename) available from DIC Corp., and "Quatrex-2010" "(tradename) available from The Dow Chemical Co.; cresol novolak-type epoxy resins "YDCN-702S" (tradename) available from Toto Kasei Co., Ltd., and "EOCN-100" (tradename) available from Nippon Kayaku Co., Ltd.; polyfunctional epoxy resins "EPPN-501" (tradename) available from Nippon Kayaku Co., Ltd., "TACTIX-742" (tradename) available from The Dow Chemical Co., "VG-3010" (tradename) available from Mitsui Chemicals, Inc., and "1032S" (tradename) available from Japan Epoxy Resin Corp.; a naphthalene skeleton-containing epoxy resin "HP-4032" (tradename) available from DIC Corp.; an alicyclic epoxy resin "CEL-3000" (tradename) available from Daicel Corp.; epoxidized polybutadienes "PB-3600" (tradename) available from Daicel Corp., and "E-1000-6.5" (tradename) available from Nippon Petrochemicals Co., Ltd.; amine-type epoxy resins "ELM-100" (tradename) available from Sumitomo Chemical Co., Ltd., and "YH-434L" (tradename) available from Toto Kasei Co., Ltd.; a resorcin-type epoxy resin "DENACOL EX-201" (tradename) available from Nagase Chemtex Co., Ltd.; a neopentyl glycol-type epoxy resin "DENACOL EX-211" (tradename) available from Nagase Chemtex Co., Ltd.; a hexanediol-type epoxy resin "DENACOL EX-212" (tradename) available from Nagase Chemtex Co., Ltd.; ethylene/propylene glycol-type epoxy resins "DENACOL EX-810", "DENACOL EX-811", "DENACOL EX-850", "DENACOL EX-851", "DENACOL EX-821", "DENACOL EX-830", "DENACOL EX-832", "DENACOL EX-841" and "DENACOL EX-861" (tradenames) all available from Nagase Chemtex Co., Ltd.; and epoxy resins represented by the following general formula (XI) "E-XL-24" and "E-XL-3L" (tradenames) both available from Mitsui Chemicals, Inc.

(XI)

wherein v is an integer of 0 to 5.

Among these epoxy resins, preferred are bisphenol F-type epoxy resins, epoxidized polybutadienes and novolak-type epoxy resins. These epoxy resins may be used alone or in combination of any two or more thereof.

The epoxy resin preferably has a molecular weight or a number-average molecular weight of from 160 to 3000. The number-average molecular weight of the epoxy resin is the value as measured by gel permeation chromatography using a calibration curve of a polystyrene as a reference standard substance (hereinafter referred to merely as a "GPC method"). The epoxy resin also preferably has an epoxy equivalent of from 80 to 1000 and more preferably from 100 to 500. The epoxy resin is preferably used in an amount of from 0.1 to 2.0 parts by weight and more preferably from 0.5 to 1.5 parts by weight on the basis of 100 parts by weight of a total amount of the resin paste composition.

The epoxy resin may also contain a compound having one epoxy group in a molecule thereof [monofunctional epoxy compound (reactive diluent)]. Examples of commercially available products of the monofunctional epoxy compound include "PGE" (tradename; phenyl glycidyl ether) available from Nippon Kayaku Co., Ltd., "PP-101" (tradename; alkyl phenol monoglycidyl ether) available from Toto Kasei Co., Ltd., "ED-502" (tradename; aliphatic monoglycidyl ether) available from ADEKA Corp., "ED-509" (tradename; alkyl phenol monoglycidyl ether) available from ADEKA Corp., "YED-122" (tradename; alkyl phenol monoglycidyl ether) available from Japan Epoxy Resin Corp., "KBM-403" (tradename; 3-glycidoxypropylmethyl diethoxysilane) available from Shin-Etsu Chemical Co., Ltd., and "TSL-8350", "TSL-8355" and "TSL-9905" (tradenames; 3-glycidoxypropyl trimethoxysilane, 3-glycidoxypropylmethyl dimethoxysilane and 1-(3-glycidoxypropyl)-1,1,3,3,3-pentamethyl disiloxane, respectively) all available from Momentive Performance Materials, Inc. The monofunctional epoxy compound may be used in such an amount as not to adversely affect properties of the resin paste composition of the present invention, and is preferably used in an amount of 10 parts by weight or less and more preferably from 1 to 5 parts by weight on the basis of 100 parts by weight of a total amount of the epoxy resins.

The resin paste composition of the present invention may also contain an amine-based compound. The amine-based compound used in the present invention is not particularly limited. Examples of the amine-based compound include dicyandiamide, a dibasic acid dihydrazide represented by the following general formula (XII)"

(XII)

wherein $R^{19}$ is a divalent aromatic group such as a m-phenylene group and a p-phenylene group or a linear or branched alkylene group having 2 to 12 carbon atoms, such as "ADH", "PDH" and "SDH" (tradenames) all available from Japan Finechem Company Inc., a microcapsule type curing agent as a reaction product of an epoxy resin and an amine compound "Novacure" (tradename) available from Asahi Kasei Corp., and imidazoles "Curezol 2P4MHZ", "Curezol C17Z" and "Curezol 2PZ-OK" (tradenames) all available from Shikoku Chemicals Corp. These amine-based compounds may be used alone or in combination of any two or more thereof. The amine-based compound is preferably compounded in an amount of from 0.05 to 0.3 part by weight and more preferably from 0.09 to 0.15 part by weight on the basis of 100 parts by weight of the resin paste composition. When the amount of the amine-based compound compounded is less than 0.05 part by weight, the resulting resin paste composition tends to be deteriorated in curability. On the other hand, when the amount of the amine-based compound compounded is more than 0.3 part by weight, the resulting resin paste composition tends to be deteriorated in stability.

The resin paste composition of the present invention may also contain a flexibilizer in order to impart a flexibility thereto. Examples of the flexibilizer include rubber-based compounds and thermoplastic resins. Among these compounds, preferred are butadiene-based rubbers having a butadiene skeleton.

Examples of the butadiene-based rubbers used in the present invention include liquid rubbers such as epoxidized polybutadiene rubbers, maleic polybutadienes, acrylonitrile butadiene rubbers, carboxy-terminated acrylonitrile butadiene rubbers, amino-terminated acrylonitrile butadiene rubbers, vinyl-terminated acrylonitrile butadiene rubbers and styrene butadiene rubbers.

These liquid rubbers preferably have a number-average molecular weight of from 500 to 10,000 and more preferably from 1,000 to 5,000. When the molecular weight of the liquid rubbers is excessively small, the resulting resin paste composition tends to be deteriorated in flexibilizing effect. On the other hand, when the molecular weight of the liquid rubbers is excessively large, the resulting resin paste composition tends to exhibit an increased viscosity, resulting in poor working efficiency. The number-average molecular weight of the liquid rubbers is the value as measured by vapor pressure osmometry or GPC.

The thermoplastic resin used as the flexibilizer preferably has a number-average molecular weight of from 10,000 to 300,000 and more preferably from 20,000 to 200,000. When the molecular weight of the thermoplastic resin is excessively small, the resulting resin paste composition tends to be deteriorated in flexibilizing effect. On the other hand, when the molecular weight of the thermoplastic resin is excessively large, the resulting resin paste composition tends to exhibit an increased viscosity, resulting in poor working efficiency. The flexibilizer is preferably compounded in the resin paste composition in an amount of from 3 to 12 parts by weight and more preferably from 4 to 8 parts by weight on the basis of 100 parts by weight of a total amount of the resin paste composition. When the amount of the flexibilizer compounded is less than 3 parts by weight, the resulting resin paste composition tends to be deteriorated in flexibilizing effect. On the other hand, when the amount of the flexibilizer compounded is more than 12 parts by weight, the resulting resin paste composition tends to exhibit an increased viscosity, resulting in poor working efficiency.

The resin paste composition of the present invention may also contain a coupling agent. The coupling agent used in the present invention is not particularly limited. Examples of the coupling agent include various coupling agents such as a silane coupling agent, a titanate-based coupling agent, an aluminum-based coupling agent, a zirconate-based coupling agent and a zircoaluminate-based coupling agent.

Specific examples of the coupling agent include silane coupling agents such as methyl trimethoxysilane, methyl triethoxysilane, phenyl trimethoxysilane, phenyl triethoxysilane, vinyl trimethoxysilane, vinyl triethoxysilane, vinyl triacetoxysilane, vinyl-tris(2-methoxyethoxy)silane, γ-methacryloxypropyl trimethoxysilane, γ-methacryloxypropylmethyl dimethoxysilane, methyl tri(methacryloxyethoxy)silane, γ-acryloxypropyl trimethoxysilane, γ-aminopropyl trimethoxysilane, γ-aminopropyl triethoxysilane, N-β-(aminoethyl)-γ-aminopropyl trimethoxysilane, N-β-(aminoethyl)-γ-aminopropylmethyl dimethoxysilane, N-β-(N-vinylbenzylaminoethyl)-γ-aminopropyl trimethoxysilane, γ-anilinopropyl trimethoxysilane, γ-ureidopropyl trimethoxysilane, γ-ureidopropyl triethoxysilane, 3-(4,5-dihydroimidazolyl)propyl triethoxysilane, β-(3,4-epoxycyclohexyl)ethyl trimethoxysilane, γ-glycidoxypropyl trimethoxysilane, γ-glycidoxypropylmethyl diethoxysilane, γ-glycidoxypropylmethyl diisopropenoxysilane, methyl triglycidoxysilane, γ-mercaptopropyl trimethoxysilane, γ-mercaptopropyl triethoxysilane, γ-mercaptopropylmethyl dimethoxysilane, trimethylsilyl isocyanate, dimethylsilyl isocyanate, phenylsilyl triisocyanate, tetraisocyanate silane, methylsilyl triisocyanate, vinylsilyl triisocyanate and ethoxysilane triisocyanate; titanate-based coupling agents such as isopropyl triisostearoyl titanate, isopropyl tridecylbenzenesulfonyl titanate, isopropyl tris(dioctyl pyrophosphate)titanate, tetraisopropyl bis(dioctyl phosphite)titanate, tetraoctyl bis(ditridecyl phosphite)titanate, tetra(2,2-diallyloxymethyl-1-butyl)bis(di-tridecyl)phosphite titanate, bis(dioctyl pyrophosphate)oxyacetate titanate, bis(dioctyl pyrophosphate) ethylene titanate, isopropyl trioctanoyl titanate, isopropyl dimethacryl isostearoyl titanate, isopropyl (dioctyl phosphate) titanate, isopropyl tricumylphenyl titanate, isopropyl tri(N-aminoethyl.aminoethyl)titanate, dicumyl phenyloxyacetate titanate and diisostearoyl ethylene titanate; aluminum-based coupling agents such as acetoalkoxyaluminum diisopropionate; and zirconate-based coupling agents such as tetrapropyl zirconate, tetrabutyl zirconate, tetra(triethanol amine)zirconate, tetraisopropyl zirconate, zirconium acetyl acetonate acetyl acetone zirconium butyrate and zirconium stearate butyrate. Meanwhile, among the above coupling agents, γ-glycidoxypropyl trimethoxysilane, γ-glycidoxypropylmethyl diethoxysilane, etc., are also involved in the above-mentioned monofunctional epoxy compounds (reactive diluent) which may be used together with the epoxy resin. These compounds are silane coupling agents having one epoxy group in a molecule thereof and can exhibit both of the above functions, and therefore are exemplified here again as the silane coupling agent.

The coupling agent is preferably compounded in the resin paste composition in an amount of from 0.5 to 6.0 parts by weight and more preferably from 1.0 to 5 parts by weight on the basis of 100 parts by weight of a total amount of the resin paste composition. When the amount of coupling agent compounded is less than 0.5 part by weight, the resulting resin paste composition tends to be deteriorated in bond strength. On the other hand, when the amount of coupling agent compounded is more than 6 parts by weight, the resulting resin paste composition tends to contain a large amount of volatile components and therefore tends to suffer from occurrence of voids in the obtained cured product.

The resin paste composition of the present invention may further contain a moisture absorbent such as calcium oxide and magnesium oxide, a fluorine-based surfactant, a nonionic surfactant, a wetting improver such as higher fatty acids, a defoaming agent such as silicone oils, an ion-trapping agent such as inorganic ion exchangers, a diluent for controlling a viscosity of the composition, etc., if required. These additives may be appropriately added singly or in combination of any two or more thereof.

The resin paste composition of the present invention may be produced in the following manner. That is, a granular aluminum powder having an average particle diameter of from 2 to 10 μm, a flake-shaped silver powder having an average particle diameter of from 1 to 5 μm, an acrylic ester compound or methacrylic ester compound and a radical initiator are charged together with various optional additives such as a butadiene-based rubber as a flexibilizer and a coupling agent into an apparatus constructed of appropriate combination of dispersing and dissolving devices such as a stirrer, a hybrid mixer and a planetary mixer either at one time or intermittently in divided parts, and the contents of the apparatus may be then subjected to mixing, dissolution, deaggregation/kneading or dispersing, if required, while heating, to prepare a uniform paste. Alternatively, the above acrylic ester compound or methacrylic ester compound may also be compounded with an epoxy resin, or a silicone resin, a urethane resin, an acrylic resin, etc., to prepare the uniform paste.

Meanwhile, the resin paste composition of the present invention preferably contains substantially no organic solvent from the viewpoint of preventing generation of outgases. The term "containing substantially no organic solvent" as used herein means that a trace amount of an organic solvent may be present in the composition unless properties of the resin paste composition of the present invention are considerably deteriorated by the organic solvent. More specifically, the content of the organic solvent in the resin paste composition may be suitably 1000 ppm or less and is preferably 500 ppm or less and more preferably 100 ppm or less on the basis of a total amount of the resin paste composition. However, it is especially preferred that the resin paste composition of the present invention contain no organic solvent. The organic solvent used herein means such an organic compound which contains no ethylenically unsaturated group in a molecule thereof, is kept in a liquid state as measured at 25° C. and has a boiling point of 250° C. or lower under atmospheric pressure.

The viscosity of the resin paste composition of the present invention as measured at 25° C. is preferably from 30 to 200 Pa·s, more preferably from 40 to 150 Pa·s and especially preferably from 40 to 80 Pa·s from the viewpoint of a good working efficiency. Meanwhile, the viscosity is the value as measured using a rotary viscometer according to JIS Z8803-1991.

In the present invention, a semiconductor element is bonded onto a supporting member through the thus prepared resin paste composition, and then encapsulated to manufacture a semiconductor device.

Examples of the supporting member include a lead frame such as a copper lead frame, a glass epoxy substrate (substrate formed from a glass fiber-reinforced epoxy resin), and an organic substrate such as a BT substrate (substrate using a BT resin obtained from a cyanate monomer and an oligomer thereof, and bismaleimide).

In the case where the semiconductor element is bonded onto the supporting member such as a lead frame through the resin paste composition of the present invention, the resin paste composition is first applied onto the supporting member by a dispensing method, and then the semiconductor element is pressed and bonded onto the applied composition. Thereafter, the resulting product is heated using a heater such as an oven and a heat block to cure the composition. Further, the resulting product is subjected to wire bonding step and then encapsulated by an ordinary method to thereby manufacture a complete semiconductor device.

The above heating and curing step is usually carried out at a temperature of from 150 to 220° C. and preferably from 180 to 200° C. for a period of from 30 second to 2 hour and preferably from 1 hour to 1.5 hour, although these conditions may vary depending upon which procedure is used to cure the composition, i.e., curing at a low temperature for a long period of time or curing at a high temperature for a short period of time.

EXAMPLES

The present invention is described in more detail by referring to the following Examples. However, it should be noted that these examples are only illustrative and not intended to limit the invention thereto.

In the following Examples and Comparative Examples, the following materials were used.
(1) Aluminum Powder:
"VA-2000" (product name of an aluminum powder available from Yamaishi Metal Co., Ltd.; shape: granular shape; average particle diameter: 6.7 μm).
"No. 800F" (product name of an aluminum powder available from Minalco Ltd.; shape: granular shape; average particle diameter: 3.1 μm)
"No. 500D" (product name of an aluminum powder available from Yamato Metal Powder Co., Ltd.; shape: flake shape; average particle diameter: 30.1 μm)
"No. 500M" (product name of an aluminum powder available from Minalco Ltd.; shape: granular shape; average particle diameter: 10.4 μm)
"No. 22000" (product name of an aluminum powder available from Yamato Metal Powder Co., Ltd.; shape: flake shape; average particle diameter: 40.0 μm)

Meanwhile, electron microphotographs indicating an appearance of particles of the aluminum powders used are shown in FIGS. 1(A) to 1(E), and the results of measurement of a particle size distribution thereof are shown in Table 1.

TABLE 1

| Al powder | Shape | Average particle diameter (μm) | Maximum particle diameter (μm) | Particle size distribution | | |
|---|---|---|---|---|---|---|
| | | | | 10% (μm) | 50% (μm) | 90% (μm) |
| No. 800F | Granular | 3.1 | 18.50 | 1.57 | 3.13 | 6.15 |
| VA-2000 | Granular | 6.7 | 37.00 | 3.02 | 6.74 | 15.58 |
| No. 500M | Granular | 10.4 | 52.33 | 5.50 | 10.40 | 20.14 |
| No. 500D | Flake-shaped | 30.1 | 313.08 | 13.02 | 30.11 | 73.18 |
| No. 22000 | Flake-shaped | 40.0 | | | | |

(2) Silver Powder:
"AgC-212DH" (tradename of a silver powder available from Fukuda Metal Foil & Powder Co., Ltd.; shape: flake shape; average particle diameter: 2.9 μm)
"SF-65LV" (tradename of a silver powder available from Ferro Japan Co., Ltd.; shape: flake shape; average particle diameter: 3.5 μm)
(3) Acrylic Ester Compound and Methacrylic Ester Compound:
"FA-512A" (product name of dicyclopentenyloxyethyl acrylate available from Hitachi Chemical Co., Ltd.)
"SR-349" (product name of ethoxylated bisphenol A diacrylate available from Nippon Kayaku Co., Ltd.)
(4) Epoxy Resin:
"N-665-EXP" (product name of a cresol novolak-type epoxy resin available from DIC Corp.; epoxy equivalent: 198 to 208)
(5) Radical Initiator:
"Torigonox 22-70F" (product name of 1,1-di(t-butylperoxy)cyclohexane available from Kayaku Akzo Corp.)
(6) Butadiene-Based Rubber (Flexibilizer)
"CTBN-1009SP-S" (tradename of carboxyl-terminated acrylonitrile polybutadiene copolymer available from Ube Industries, Ltd.)
"EPOLEAD PB4700" (tradename of epoxidized polybutadiene available from Dicel Corp.)
(7) Coupling Agent:
"KBM-403" (product name of γ-glycidoxypropylmethyl diethoxysilane available from Shin-Etsu Chemical Co., Ltd.)
(8) Amine Compound:
"Dicy" (tradename of dicyandiamide available from Japan Epoxy Resin Corp.)

Examples 1 to 8 and Comparative Example 1 to 3

Respective materials were mixed with each other at a mixing ratio shown in Table 2 and kneaded using a planetary mixer, and then subjected to defoaming treatment at a pressure of 666.61 Pa (5 Torr) or less for 10 min, thereby obtaining a resin paste composition. The thus obtained resin paste composition was examined with respect to its properties (including a viscosity and a viscosity stability, a die shear strength and a volume resistivity). The results are shown in Table 2.
(1) Viscosity and Viscosity Stability:
a) Viscosity:
The viscosity (Pa·s) of the resin paste composition was measured using an EHD-type rotary viscometer (available from Tokyo Keiki Inc.) with a 3° cone rotor at a rotating speed of 0.5 rpm at 25° C.

b) Viscosity Stability:

The viscosity of the resin paste composition determined in the above a) was used as an initial value, and the resin paste composition was sampled after the elapse of 1 day, 3 days and 7 days from the initial measurement, and the respective samples were subjected to measurement of their viscosity (Pa·s) using an EHD-type rotary viscometer (available from Tokyo Keiki Inc.) with a 3° cone rotor at a rotating speed of 0.5 rpm at 25° C.

(2) Die Shear Strength:

The resin paste composition was applied onto an Ni/Au-plated copper frame, an Ag-plated copper lead frame and an Ag ring-plated copper lead frame such that a coating amount of the composition was about 0.5 mg, and an Si chip having a size of 3 mm×3 mm (thickness: about 0.4 mm) was pressed and bonded onto the thus applied composition. The resulting test specimen was placed in an oven and heated to 180° C. over 30 min and held at 180° C. for 1 hour to cure the resin paste composition. Then, the test specimen was held at 260° C. for 20 second using an automatic bond tester "BT4000" available from DAGE to measure a die shear strength (MPa) thereof. Meanwhile, the measurement of the die shear strength was carried out with respect to the 10 test specimens to attain an average value thereof.

Figure 1:
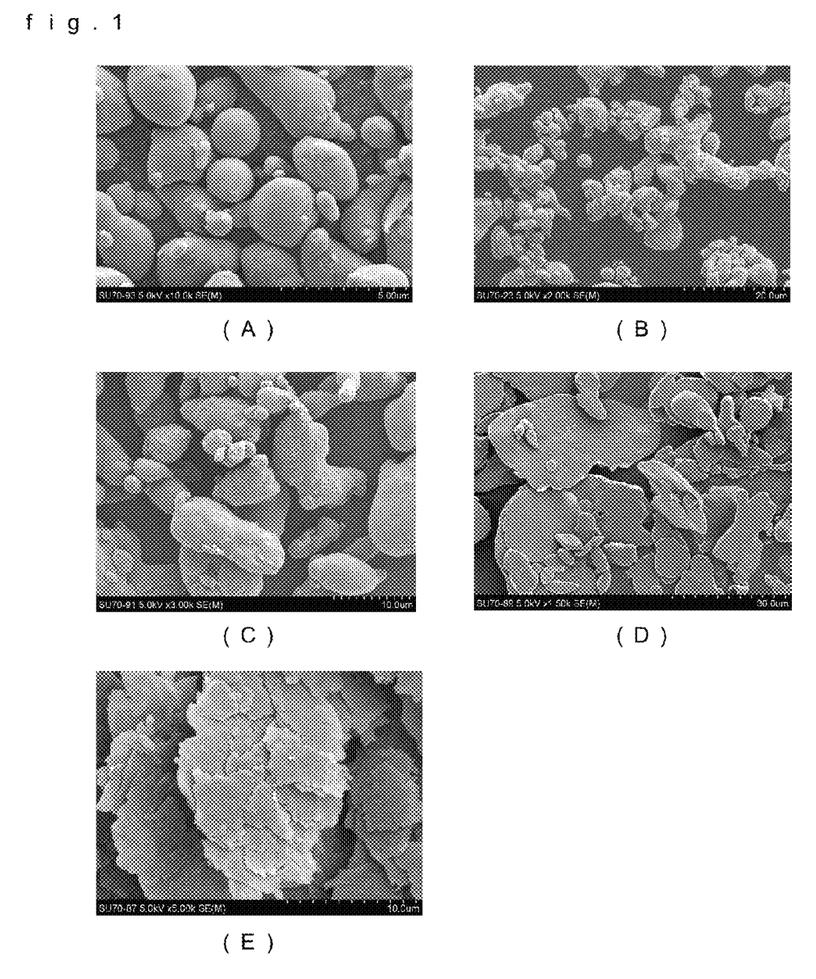
Figure 2:
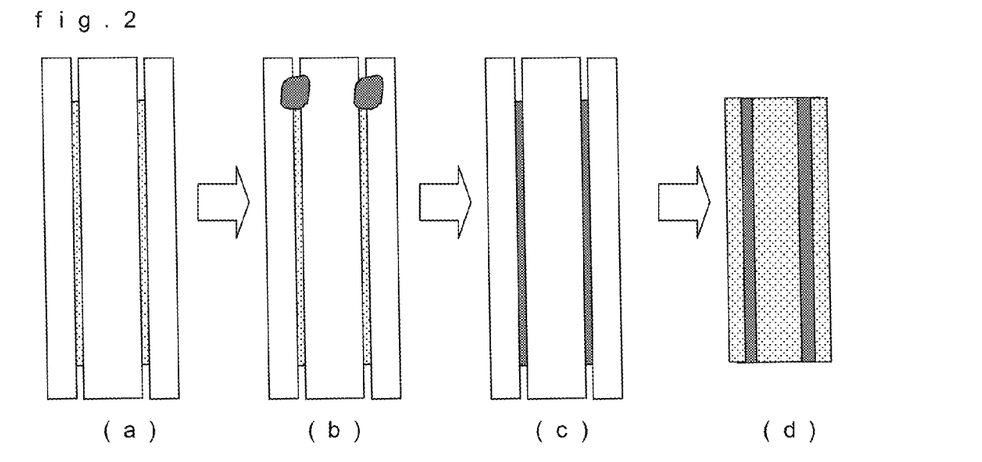
FIG. 2 is an explanatory view showing procedures (a) to (d) for preparing a test specimen used for measuring a volume resistivity.

(3) Volume Resistivity:

As shown in FIG. 2(a), a paper tape "No. 7210F" (dimension width: 18 mm; thickness: 0.10 mm) available from Nitto Denko CS System Corp., was adhered onto a slide glass (dimension: 76×26 mm; thickness: 0.9 to 1.2 mm) available from Tokyo Glass Kikai Corp., and the resin paste composition was placed on grooves each having a width of about 2 mm therebetween (FIG. 2(b)) and spread flat into the grooves using a slide glass or the like (FIG. 2(c)). Further, the resulting product was heated in an oven at 180° C. for 1 h to cure the resin paste composition (FIG. 2(d)). The thus obtained test specimen was subjected to measurement of a volume resistivity (Ω·cm) thereof using a digital multi-meter "TR6846" available from ADVANTEST Corp.

(4) Thermal Conductivity:

The thermal conductivity was measured by a laser flash method under the following conditions. Meanwhile, the larger measured value indicates a more excellent thermal conductivity.

Measuring apparatus: "LF A447 (Nanoflash)" available from Netzsch Inc. (Germany)
Light irradiated: Xenon lamp light
Temperature detector: Infrared detector (InSb sensor)
Atmosphere: in air
Measuring temperature: 25° C.

Figure 3:
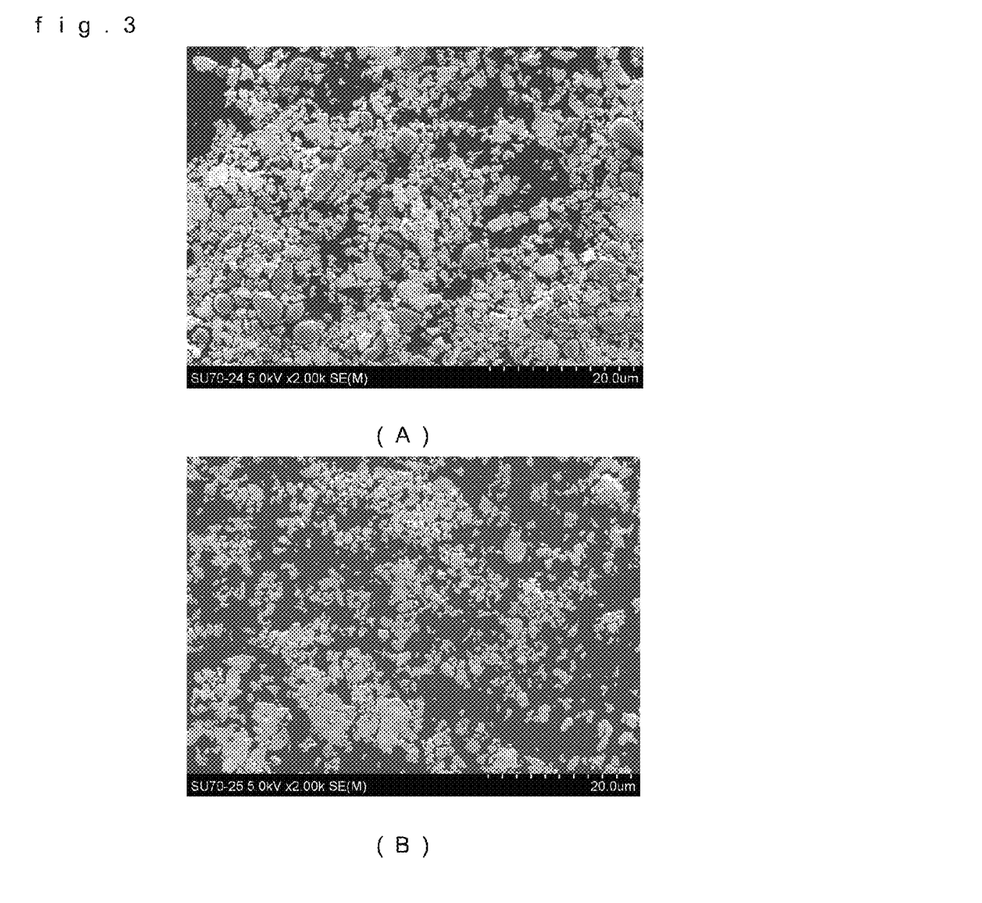

FIG. 3(A) shows the condition of a mixed powder of the silver powder (AgC-212DH) and the aluminum powder (VA-200) used in the respective resin pastes obtained in Examples 1 and 4 to 8, whereas FIG. 3(B) shows the condition of a mixed powder of the silver powders (AgC-212DH and SF-65LV) used in the resin paste obtained in Comparative Example 1.

TABLE 2

| | | Examples | | | | | | | | Comparative Examples | | |
|---|---|---|---|---|---|---|---|---|---|---|---|---|
| | | 1 | 2 | 3 | 4 | 5 | 6 | 7 | 8 | 1 | 2 | 3 |
| Formulation (weight part) | | | | | | | | | | | | |
| Acrylic ester | FA-512A | 6.0 | 6.0 | 6.0 | 4.9 | 5.5 | 8.6 | 11.3 | 14.1 | 6.0 | 6.0 | 6.0 |
| Bifunctional acryl | SR-349 | 8.4 | 8.4 | 8.4 | 8.6 | 8.6 | 5.5 | 2.8 | — | 8.4 | 8.4 | 8.4 |
| Epoxy resin | N-665-EXP | 1.3 | 1.3 | 1.3 | 0.7 | — | — | — | — | 1.3 | 1.3 | 1.3 |
| Coupling agent | KBM-403 | 0.7 | 0.7 | 0.7 | 0.7 | 0.7 | 0.7 | 0.7 | 0.7 | 0.7 | 0.7 | 0.7 |
| Amine compound | Dicy | 0.1 | 0.1 | 0.1 | 0.1 | 0.1 | 0.1 | 0.1 | 0.1 | 0.1 | 0.1 | 0.1 |
| Initiator | Trigonox 22-70E | 0.7 | 0.7 | 0.7 | 0.7 | 0.7 | 0.7 | 0.7 | 0.7 | 0.7 | 0.7 | 0.7 |
| Flexibilizer | CTBN-1009SP-S | 0.8 | 0.8 | 0.8 | 0.9 | 0.9 | 0.9 | 0.9 | 0.9 | 0.8 | 0.8 | 0.8 |
| | PB4700 | 4.8 | 4.8 | 4.8 | 4.9 | 4.9 | 4.9 | 4.9 | 4.9 | 4.8 | 4.8 | 4.8 |
| Silver powder | SF-65LV[1] | — | — | — | — | — | — | — | — | 16.6 | — | — |
| | AgC-212DH[2] | 45.8 | 45.8 | 45.8 | 45.8 | 45.8 | 45.8 | 45.8 | 45.8 | 59.7 | 59.7 | 59.7 |
| Aluminum powder | VA-2000[3] | 30.5 | — | — | 30.5 | 30.5 | 30.5 | 30.5 | 30.5 | — | — | — |
| | No. 800F[4] | — | 30.5 | — | — | — | — | — | — | — | — | — |
| | No. 500M[5] | — | — | 30.5 | — | — | — | — | — | — | — | — |
| | No. 22000[6] | — | — | — | — | — | — | — | — | — | 16.6 | — |
| | No. 500D[7] | — | — | — | — | — | — | — | — | — | — | 16.6 |
| Properties | | | | | | | | | | | | |
| Viscosity stability (Pa·S) | Initial | 67 | 191 | 110 | 165 | 170 | 85 | 65 | 54 | 53 | *[8] | 83 |
| | 1st day | 66 | 164 | 105 | 160 | 160 | 80 | 60 | 50 | 52 | | 85 |
| | 3rd day | 61 | 146 | 89 | 150 | 160 | 80 | 60 | 45 | 50 | | 85 |
| | 7th day | 62 | 129 | 81 | 140 | 150 | 70 | 55 | 40 | 51 | | 86 |
| Die shear strength (MPa) | Substrate Copper (Ni/Au-plated) | 4.7 | 4.1 | 4.1 | 4.0 | 4.2 | 4.8 | 5.5 | 5.6 | 5.2 | 5.4 | 3.7 |
| | Copper (Ag spot-plated) | 3.7 | 3.1 | 3.0 | 2.0 | 3.0 | 3.6 | 3.9 | 5.0 | 3.6 | 3.4 | 3.4 |

TABLE 2-continued

| | | Examples | | | | | | | | Comparative Examples | | |
|---|---|---|---|---|---|---|---|---|---|---|---|---|
| | | 1 | 2 | 3 | 4 | 5 | 6 | 7 | 8 | 1 | 2 | 3 |
| | Copper (Ag ring-plated) | 4.4 | 5.8 | 4.6 | 4.5 | 5.3 | 4.6 | 4.9 | 4.6 | 4.4 | 4.5 | 3.9 |
| Volume resistivity ($\Omega \cdot cm$) | | 1.17E−01 | 6.17E−02 | 2.06E+03 | 7.47E+02 | 2.89E+02 | 1.24E−02 | 6.27E−03 | 5.56E−03 | 1.75E−02 | 1.38E−02 | 2.08E−02 |
| Thermal conductivity ($Wm^{-1}K^{-1}$) | | 2.18 | 1.08 | 1.40 | 1.11 | 1.27 | 2.34 | 2.84 | 2.47 | 0.81 | 0.47 | 0.67 |

Note
*[1]Scale shape; average particle diameter: 3.3 μm
*[2]Scale shape; average particle diameter: 2.9 μm
*[3]Granular shape; average particle diameter: 6.7 μm
*[4]Granular shape; average particle diameter: 3.2 μm
*[5]Granular shape; average particle diameter: 10.4 μm
*[6]Flake shape; average particle diameter: 40.0 μm
*[7]Flake shape; average particle diameter: 30.1 μm
*[8]Not measurable owing to high viscosity.

From the results shown in Table 2, it was confirmed that the resin paste compositions obtained in Examples according to the present invention exhibited a high thermal conductivity. In addition, it was confirmed that the resin paste compositions obtained according to the present invention (in particular, those obtained in Examples 7 and 8) had a bond strength equal to or higher than that of the conventional resin paste composition using the silver powders as a filler (Comparative Example 1) and a volume resistivity lower than that of the conventional resin paste composition. From the above results, it was recognized that the resin paste composition according to the present invention was capable of exhibiting excellent properties such as thermal conductivity, bond strength and volume resistivity which were equal to or superior to those of the conventional resin paste compositions using the silver powders as a filler without using a large amount of the rare silver powders.

The invention claimed is:

1. A resin paste composition comprising an organic compound, a granular aluminum powder having an average particle diameter of from 2 to 10 μm and an apparent density of from 0.40 to 1.20 g/cm$^3$, and a silver powder having a flake shape and an average particle diameter of from 1 to 5 μm.

2. The resin paste composition according to claim 1, wherein the silver powder has a tap density of from 3 to 6 g/cm$^3$.

3. The resin paste composition according to claim 1, wherein the silver powder has a specific surface area of from 0.5 to 1 m$^2$/g.

4. The resin paste composition according to claim 1, wherein a weight ratio of aluminum to silver (aluminum/silver) in the composition is from 1/9 to 8/2.

5. The resin paste composition according to claim 1, wherein the organic compound is at least one compound selected from the group consisting of an acrylic compound, an epoxy resin, a silicone resin, a urethane resin and an acrylic resin.

6. The resin paste composition according to claim 5, wherein the organic compound is at least one compound selected from the group consisting of an acrylic compound, an epoxy resin and an acrylic resin.

7. The resin paste composition according to claim 6, wherein the organic compound is an acrylic compound.

8. The resin paste composition according to claim 7, wherein the acrylic compound is an acrylic ester compound or a methacrylic ester compound.

9. The resin paste composition according to claim 5 further comprising at least one additive selected from the group consisting of an initiator, a flexibilizer and a coupling agent.

10. The resin paste composition according to claim 1, wherein the organic compound is an acrylic ester compound or a methacrylic ester compound, and the composition further comprises a radical initiator.

11. The resin paste composition according to claim 10 further comprising a flexibilizer.

12. The resin paste composition according to claim 10 further comprising a coupling agent.

13. A semiconductor device manufactured by bonding a semiconductor element onto a supporting member through the resin paste composition as defined in claim 1, and then encapsulating the resulting bonded product.

14. The resin paste composition according to claim 1, wherein the aluminum powder has an average particle diameter of from 3 to 8 μm.

15. The resin paste composition according to claim 1, wherein the aluminum powder has an apparent density of from 0.55 to 0.95 g/cm$^3$.

16. The resin paste composition according to claim 1, wherein a total amount of the aluminum powder and the silver powder in the composition is from 60 to 85 parts by weight on the basis of 100 parts by weight of a total amount of the composition.

17. The resin paste composition according to claim 1, wherein a total amount of the aluminum powder and the silver powder in the composition is from 65 to 80 parts by weight on the basis of 100 parts by weight of a total amount of the composition.

18. The resin paste composition according to claim 1, wherein a total amount of the aluminum powder and the silver powder in the composition is from 70 to 80 parts by weight on the basis of 100 parts by weight of a total amount of the composition.

19. The resin paste composition according to claim 1, wherein a weight ratio of the aluminum powder to the silver powder (aluminum/silver) in the composition is from 3/7 to 7/3.

20. The resin paste composition according to claim 1, wherein a weight ratio of the aluminum powder to the silver powder (aluminum/silver) in the composition is from 4/6 to 5/5.

* * * * *